(12) United States Patent
Saha et al.

(10) Patent No.: US 11,312,067 B2
(45) Date of Patent: Apr. 26, 2022

(54) SYSTEM AND METHOD FOR SUB MICRON ADDITIVE MANUFACTURING

(71) Applicant: Lawrence Livermore National Security, LLC, Livermore, CA (US)

(72) Inventors: Sourabh Kumar Saha, Livermore, CA (US); Robert Matthew Panas, Dublin, CA (US); Shih-Chi Chen, Hong Kong (CN)

(73) Assignee: Lawrence Livermore National Security, LLC, Livermore, CA (US)

( * ) Notice: Subject to any disclaimer, the term of this patent is extended or adjusted under 35 U.S.C. 154(b) by 891 days.

(21) Appl. No.: 15/857,917

(22) Filed: Dec. 29, 2017

(65) Prior Publication Data

US 2019/0126537 A1 May 2, 2019

Related U.S. Application Data

(63) Continuation-in-part of application No. PCT/US2017/059326, filed on Oct. 31, 2017.

(51) Int. Cl.
*G02B 27/28* (2006.01)
*B33Y 10/00* (2015.01)
(Continued)

(52) U.S. Cl.
CPC .......... *B29C 64/135* (2017.08); *B29C 64/273* (2017.08); *B29C 64/286* (2017.08);
(Continued)

(58) Field of Classification Search
None
See application file for complete search history.

(56) References Cited

U.S. PATENT DOCUMENTS

| 5,739,898 A | 4/1998 | Ozawa et al. |
| 6,312,134 B1 | 11/2001 | Jain et al. |

(Continued)

FOREIGN PATENT DOCUMENTS

| CN | 101226343 A | 7/2008 |
| CN | 104345579 A | 2/2015 |

(Continued)

OTHER PUBLICATIONS

ThorLabs, Variable Beamsplitter/Attenuator, Aug. 30, 2011 <https://web.archive.org/web/20110830213634/https://www.thorlabs.com/newgrouppage9.cfm?objectgroup_id=5503> (Year: 2011).*

(Continued)

*Primary Examiner* — Armand Melendez
(74) *Attorney, Agent, or Firm* — Harness, Dickey & Pierce, P.L.C.

(57) ABSTRACT

An apparatus is disclosed for performing an additive manufacturing operation to form a structure by processing a photopolymer resist material. The apparatus may incorporate a laser for generating a laser beam, and a tunable mask for receiving the laser beam which has an optically dispersive element. The mask splits the laser beam into a plurality of emergent beams each having a subplurality of beamlets of varying or identical intensity, with each beamlet emerging from a unique subsection of illuminated regions of the mask. A collimator collimates at least one of the emergent beams to form a collimated beam. One or more focusing elements focuses the collimated beam into a focused beam which is projected as a focused image plane on or within the resist material. The focused beam simultaneously illuminates a layer of the resist material to process an entire layer in a parallel fashion.

18 Claims, 8 Drawing Sheets

(51) Int. Cl.
  *B29C 64/135* (2017.01)
  *B29C 64/286* (2017.01)
  *B29C 64/273* (2017.01)
  *G02B 26/08* (2006.01)
  *G03F 7/20* (2006.01)
  *B33Y 30/00* (2015.01)

(52) U.S. Cl.
  CPC ....... *G02B 26/0833* (2013.01); *G02B 27/285* (2013.01); *G03F 7/7085* (2013.01); *G03F 7/70258* (2013.01); *G03F 7/70291* (2013.01); *G03F 7/70508* (2013.01); *B33Y 10/00* (2014.12); *B33Y 30/00* (2014.12)

(56) References Cited

U.S. PATENT DOCUMENTS

| | | | |
|---|---|---|---|
| 7,902,526 | B2 | 3/2011 | Kim et al. |
| 2005/0259785 | A1 | 11/2005 | Zhang |
| 2011/0085726 | A1* | 4/2011 | Den Boef ........... G03F 7/70141 382/151 |
| 2011/0300490 | A1 | 12/2011 | Rachet et al. |
| 2012/0228802 | A1 | 9/2012 | Kan et al. |
| 2014/0093690 | A1 | 4/2014 | Noh et al. |
| 2016/0199935 | A1* | 7/2016 | Chen ................. B23K 26/0624 219/121.61 |
| 2016/0298087 | A1 | 10/2016 | Qu et al. |
| 2017/0087766 | A1 | 3/2017 | Chung et al. |
| 2017/0225393 | A1 | 8/2017 | Shkolnik |
| 2017/0283766 | A1 | 10/2017 | Hribar et al. |

FOREIGN PATENT DOCUMENTS

| | | |
|---|---|---|
| CN | 105144340 A | 12/2015 |
| CN | 105652607 A | 6/2016 |
| CN | 106660236 A | 5/2017 |
| EP | 2257854 A2 | 12/2010 |
| EP | 2537665 A1 | 12/2012 |
| KR | 10-1020149 | 3/2011 |
| WO | WO-98/41944 A1 | 9/1998 |
| WO | WO-2017050360 A1 | 3/2017 |

OTHER PUBLICATIONS

Jiang, Jun, Fast 3D temporal focusing microscopy using an electrically tunable lens, Sep. 2015, Optics Express. (Year: 2015).*

International Search Report and Written Opinion of corresponding International Application No. PCT/US2018/064189 dated Mar. 21, 2019, 14 pages.

Zhang, C., Hu, Y., Li, J., Lao, Z., Xu, B., Ni, J., Cai, Z., Wu, D., and Chu, J., 2016, "Single-exposure multiphoton fabrication of polygonized structures by an SLM-modulated Fresnel zone lens," Optical Engineering, 55(3), pp. 035102-035102.

Yang, L., Li, J., Hu, Y., Zhang, C., Lao, Z., Huang, W., and Chu, J. "Projection two-photon polymerization using a spatial light modulator." Optics Communications, 331, 2014, pp. 82-86.

Yang, L., El-Tamer, A., Hinze, U., Li J., Hu Y., Huang, W., Chu, J, and Chichkov BN. "Parallel direct laser writing of micro-optical and photonic structures using spatial light modulator." Optics and Lasers in Engineering, 70, 2015, pp. 26-32.

Li, Yi-Cheng, Cheng, Li-Chung, CChang, Chia-Yuan, Lien, Chi-Hsiang, Campagnola, P. J, and Chen, S-J. "Fast multiphoton microfabrication of freeform polymer microstructures by spatiotemporal focusing and patterned excitation." Optics Express, 20(17), 2012, pp. 19030-19038.

Gittard, S. S. D., Nguyen, A., Obata, K., Koroleva, A., Narayan, R. J., and Chichkov, B. N. "Fabrication of microscale medical devices by two-photon polymerization with multiple foci via a spatial light modulator." Biomedical optics express, 2(11), 2011, pp. 3167-3178.

Vizsnyiczai, G., Kelemen, L., and Ormos, P. "Holographic multi-focus 3D two-photon polymerization with real-time calculated holograms," Opt. Express, 22(20), 2014, pp. 24217-24223.

Mills, B., Grant-Jacob, J. A., Feinaeugle, M., and Eason, R. W., 2013, "Single-pulse multiphoton polymerization of complex structures using a digital multimirror device," Opt. Express, 21(12), pp. 14853-14858.

Spivey, Eric C. et al. "A 3D-printed Microfluidic Microdissector For High-Throughput Studies of Cellular Aging", Analytical Chemistry, vol. 86, 2014, pp. 7406-7412.

Sun, C. et al. "Projection Micro-Stereolithography Using Digital Micro-Mirror Dynamic Mask", Sensors and Actuators A: Physical, vol. 121, 2005, pp. 113-120.

International Search Report and Written Opinion for corresponding International Application No. PCT/US2017/059326 dated Jul. 27, 2018, 8 pages.

Extended European Search Report regarding European Application No. 18894862.4, dated Mar. 12, 2021.

Extended Search Report from EPO for corresponding European Patent Application No. EP17930441 dated May 3, 2021, 10 pages.

Chinese Office Action including Search Report issued in corresponding Chinese Patent Application No. 201780096399.X dated Nov. 26, 2021.

* cited by examiner

SYSTEM AND METHOD FOR SUB MICRON ADDITIVE MANUFACTURING

CROSS-REFERENCE TO RELATED APPLICATIONS

This application is a continuation-in-part of International Application No. PCT/US2017/059326, filed on Oct. 31, 2017. The entire disclosure of the above application is incorporated herein by reference.

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates generally to additive manufacturing systems and methods, often referred to as 3D printing (three-dimensional printing), and more particularly to a method and apparatus for high-rate additive manufacturing of structures with submicron features using a multiphoton, non-linear photo-absorption process, wherein the system and method enables fabrication of features that are smaller than the diffraction-limited focused illumination spots.

BACKGROUND

The statements in this section merely provide background information related to the present disclosure and may not constitute prior art.

Two-photon polymerization, also sometimes referred to as two-photon lithography, is a popular present day technique to additively manufacture complex 3D structures with submicron building blocks. This technique uses a nonlinear photo-absorption process to polymerize submicron features within the interior of the photopolymer resist material. After illumination of the desired structures inside the photoresist volume and subsequent development (washing out the non-illuminated regions), the polymerized material remains in the prescribed three-dimensional form. One example of a system that may be modified to use for two-photon polymerization is described in U.S. Patent Publication No. 2016/0199935 A1, published Jul. 14, 2016, the entire contents of which are hereby incorporated by reference into the present disclosure.

Two-photon polymerization is a direct-write technique that enables fabrication of macroscale complex 3D structures with submicron features. In its most commonly implemented form, the writing of complex structures is achieved through a serial writing technique wherein a high light intensity spot is sequentially scanned in 3D space to generate the entire structure. Due to the serial writing scheme, the rate of writing is fundamentally limited to such an extent that two-photon lithography of large volumes of functional parts is not feasible. Although attempts to increase the rate via parallelization have been made in the past, such attempts have failed to achieve the same degree of pattern complexity as that which can be accomplished with the point-scanning serial technique. Specifically, past parallelization efforts have either generated arrays of identical features or have been used to print 2D parts with no depth resolvability.

Although two-photon lithography enables fabricating features on a length scale that is not possible by other additive manufacturing techniques, the serial writing scheme that it uses limits this method to a low processing rate of ~0.1 $mm^3$/hour. This prevents taking full advantage of its submicron geometric control to fabricate functional parts. Technical and scientific challenges in solving this low processing rate limitation arise because of the slow point-by-point serial illumination technique of the existing systems. The problem of performing parallel two-photon lithography ("TPL") without adversely affecting the ability to fabricate arbitrarily complex 3D parts has not been solved in the past. The following two general approaches exist in the prior-art that partly solve the problem of parallelization of TPL: (i) "splitting" a beam and simultaneously focusing at multiple spots to fabricate identical features at multiple spots (see Vizsnyiczai, G., Kelemen, L., and Ormos, P., 2014, "*Holographic multi-focus 3D two-photon polymerization with real-time calculated holograms,*" Opt. Express, 22(20), pp. 24217-24223), (ii) projecting an arbitrarily complex 2D image into the resist to generate 2D structures without depth resolvability (see Mills, B., Grant-Jacob, J. A., Feinaeugle, M., and Eason, R. W., 2013, "*Single-pulse multiphoton polymerization of complex structures using a digital multi-mirror device,*" Opt. Express, 21(12), pp. 14853-14858).

The first approach is unsuitable for TPL scale up because, in this approach, scale-up is achieved by simultaneously printing a structure over multiple spots in the form of a periodic array. As the same beam is split into multiple identical beams, identical features are generated by each beam. Thus, no scale-up is achieved during printing of arbitrarily complex non-periodic structures using this technique.

The second approach is unsuitable for printing of complex 3D structures because depth resolvability is lost in these projection techniques. Depth resolvability refers to the ability to process a thin cross-section of the resist material without processing anything below or above the processed cross-section. For submicron additive manufacturing, depth resolution (i.e., thickness of processed cross-section of resist) ranging from less than 1 µm to a few microns is desirable. However, in this second approach, when a 2D image is projected through the resist material, a single focal plane perpendicular to the 2D projected image cannot be uniquely registered. Instead, the same 2D image is "focused" at multiple planes so that a thick 3D cured volume is generated in the form of an extrusion of the 2D image throughout the thickness of the resist layer. Thus, this scheme cannot be used to print 3D structures with depth resolved features such as those present in 3-D truss structures.

Temporal focusing of wideband femtosecond laser sources has been previously applied for fluorescence imaging of biomaterials. This technique has also been used to demonstrate material removal based fabrication processes. It has been suggested that such temporal focusing systems can also be used for multiphoton lithography. However, these teachings fail to enable high-quality 3D printing of structures without undue experimentation. Underlying this failure is the key difference between the physical mechanism of multiphoton lithography ("MPL") and that of imaging or material removal. Specifically, the dosage threshold behavior of resists used during MPL is distinct from that of material removal or imaging processes. In imaging and material removal, exposure dosage refers to the time-integrated photon energy; this is because the underlying physical processes are driven by the total amount of energy (dosage~intensity×time). In contrast, the exposure dosage during MPL nonlinearly combines the light intensity and the exposure time (dosage~(intensity)$^a$×(time)$^b$, where 'a' and 'b' are real positive numbers). This nonlinear form for the exposure dosage arises due to a combination of the nonlinear photo-absorption process and kinetics of the chemical reactions underlying the polymerization process. As a result of this, prior art techniques that achieve dosage control by time-averaging the light intensity are inappropriate for nonlinear dosage control in MPL. If such techniques are used in MPL, either blobs of overexposed structures are generated or structures with underexposed regions are obtained. Herein, the tools and techniques for appropriate dosage control in parallelized MPL are presented.

Accordingly, the needs still exist for a system and method which is able to dramatically increase the rate of two-photon lithography without adversely affecting the ability to fabricate arbitrarily complex 3D structures.

SUMMARY

In one aspect the present disclosure relates to an apparatus for performing an additive manufacturing operation to form a structure by processing a photopolymer resist material. The apparatus may comprise a laser source for generating a laser beam and a tunable mask for receiving the laser beam. The tunable mask may comprise an optically dispersive element. The tunable mask may be configured to split the laser beam into a plurality of emergent beams, wherein each emergent beam emerging from the tunable mask comprises a subplurality of beamlets of varying or identical intensity, and wherein each beamlet emerges from a unique subsection of illuminated regions of the tunable mask. A collimator may be included for collecting and collimating at least one of the emergent beams from the tunable mask to form a collimated beam. One or more focusing elements may be included to focus the collimated beam into a focused beam which is projected as a focused image plane onto or within the photopolymer resist material. The tunable mask, the collimator and the focusing elements are so oriented and positioned as to create the same optical path length between the tunable mask and the image plane for all optical frequencies of the laser beam. The focused beam simultaneously illuminates a layer of the photopolymer resist material.

In another aspect the present disclosure relates to an apparatus for performing an additive manufacturing operation to form a structure by processing a photopolymer resist material. The apparatus may comprise a laser source for generating a pulsed laser beam and a tunable mask. The tunable mask may be used for receiving the pulsed laser beam, and includes a digital micromirror device (DMD) having a plurality of independently controllable pixels that may be turned on or off. The tunable mask may be configured to split the pulsed laser beam into a plurality of emergent beams, wherein each emergent beam emerging from the tunable mask comprises a subplurality of beamlets of varying or identical intensity, and wherein each beamlet emerges from a unique pixel. A collimator may be used for collecting and collimating all wavelengths of only a select one of the plurality of emergent beams from the tunable mask, and where the collimator is configured to block all wavelengths of all other ones of the emergent beams. One or more focusing elements may be used to focus the collimated beam into a focused image plane on or within the photopolymer resist material. The tunable mask, the collimator and the focusing elements are so oriented and positioned as to create the same optical path length between the tunable mask and the focused image plane for all optical wavelengths of the pulsed laser beam. A motion stage may be included to support and move the photopolymer resist material relative to the focused image plane. The focused beam simultaneously illuminates a layer of the photopolymer resist material.

In still another aspect the present disclosure relates to a method for performing an additive manufacturing operation to form a structure by processing a photopolymer resist material. The method may comprise generating a laser beam, and directing the laser beam at a tunable mask, wherein the tunable mask comprises an optically dispersive element. The method may further include collecting at least one emergent beam from a plurality of emergent beams emerging from the tunable mask and directing it through a collimating optics to generate a collimated beam. Each emergent beam from the tunable mask comprises a plurality of beamlets of varying or identical intensity, and each beamlet emerges from a unique subsection or region of the tunable mask being illuminated by the laser beam. The method may further involve focusing the collimated beam through one or more focusing elements into a focused beam which is projected as an image plane onto or within the photopolymer resist material, wherein the tunable mask, the collimating optics, and the focusing elements are so oriented and positioned as to create the same optical path length between the tunable mask and the focused image plane for all optical frequencies of the laser beam. The method may further involve holding a select pattern of subsections on the tunable mask for a finite duration of time to cause simultaneous polymerization of select portions of the photopolymer resist material corresponding to the select pattern, at which the combined dosage effect from a duration of laser illumination and an intensity of light exceed a threshold dosage for polymerization of the photopolymer resist material.

In still another aspect the present disclosure relates to a method for performing an additive manufacturing operation to form a structure by processing a photopolymer resist material. The method may comprise generating a pulsed laser beam and directing the pulsed laser beam at a tunable mask, wherein the tunable mask is an optically dispersive element. The method may further involve collecting at least one emergent beam emerging from the tunable mask and directing it through a collimating optics to generate a collimated beam. Each emergent beam from the tunable mask comprises a plurality of beamlets of varying or identical intensity, and each beamlet emerges from a unique subsection of the illuminated regions of the tunable mask. The method may further involve focusing the collimated beam through one or more focusing elements onto an X-Y image plane on or within the photopolymer resist material. The tunable mask, the collimating optics, and the focusing elements are so oriented and positioned as to create the same optical path length between the tunable mask and the image plane for all optical frequencies of the laser beam. The plurality of beamlets are able to simultaneously illuminate a layer of the photopolymer resist material.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

FIG. 5c is an isometric illustration of an actual part produced using the masks of FIGS. 5a and 5b;

DETAILED DESCRIPTION

Figure 1:
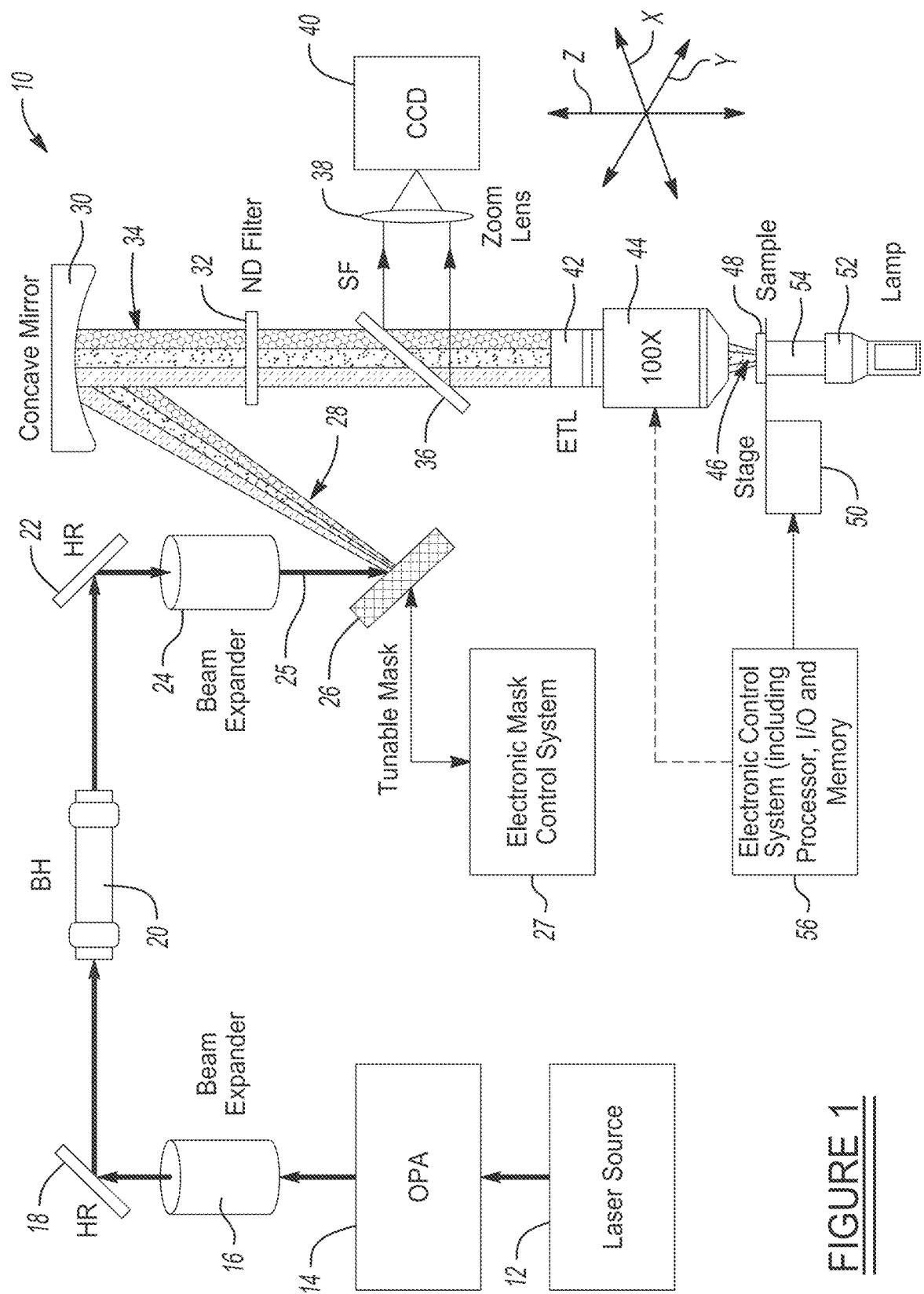
FIG. 1 is a high level block diagram of an apparatus in accordance with one embodiment of the present disclosure for performing an additive manufacturing operation to produce a sample part having submicron features.

The following description is merely exemplary in nature and is not intended to limit the present disclosure, application, or uses. It should be understood that throughout the drawings, corresponding reference numerals indicate like or corresponding parts and features.

The present disclosure overcomes the above-described manufacturing rate limitations with two-photon lithography with a system and method which implements a parallel illumination technique. The parallel illumination technique simultaneously projects an entire plane of ~1 million points, rather than the single-point illumination technique of existing commercial systems to increase the rate by at least 100 times.

The present disclosure is also distinguished from other popular 3D printing techniques (commonly referred to as projection micro-stereolithography) through its use of high peak-power pulsed laser sources, and its ability to generate features in the interior of materials being processed ("resist material"). High peak-power pulsed sources are used in this technique to ensure that nonlinear photo-absorption is observed in exclusion to single-photon linear photo-absorption. Photopolymer resist materials may be selected such that they exhibit a "thresholding" behavior, i.e., they undergo a phase transition (commonly from liquid to solid) upon exposure to light only when the nonlinear light exposure dosage exceeds a minimum threshold value (called the "threshold dosage"). Resist materials in which the light-exposed regions become more soluble in solvents may also be used. As the dosage in multiphoton lithography scales nonlinearly with the light intensity in the exposed material, steeper dosage gradients can be generated in the material during nonlinear absorption than in linear absorption. This steeper dosage gradient leads to a processed feature that is smaller than the diffraction-limited illumination spot; the steeper gradient also enables generation of individual, spot-like voxel features (or volumetric pixels) within the interior of the resist material by focusing a laser spot at an interior spot. Thus, the present apparatus and method differs from conventional micro-stereolithography in both form and function. The form differs in the use of pulsed laser sources (with the present apparatus and method, during multiphoton lithography) versus incoherent sources (in conventional micro-stereolithography); whereas, the function differs in the ability to fabricate submicron features in the interior of the resist (i.e., the present apparatus and method) vs diffraction-limited features on the surface of the resist (as with conventional micro-stereolithography).

Within the area of multiphoton lithography (MPL), the apparatus and method of the present disclosure is distinguished from existing implementations in its ability to simultaneously focus a collection of points (i.e., focus a "projected image") in the interior of the resist material without providing significant light intensity above or below the focused depth. Thus, this technique significantly increases the processing rate by parallelizing the generation of submicron features. It is important to note that with the apparatus and method described herein, the dosage at each individual focused spot may be independently tuned to generate arbitrarily complex patterns. Thus, the apparatus and method of the present disclosure differs from, and significantly improves upon, previously existing MPL implementations that split the same beam into multiple focal spots with identical intensity distribution. In addition, by incorporating features for nonlinear dosage gradients, the apparatus and method of the present disclosure differs from, and significantly improves upon, those previously existing multi-point MPL implementations that fail to preserve the steep dosage gradients experienced during single-point focusing. With the present apparatus and method, steep spatial gradients in the dosage are achieved by taking advantage of the time-dependence of intensity in beams that are generated by pulsed laser sources. Specifically, steep dosage gradients are achieved through temporal focusing of wideband femtosecond pulsed lasers.

The apparatus and method of the present disclosure takes advantage of a technique known as "temporal focusing." Temporal focusing refers to the phenomenon wherein the duration of a femtosecond pulse (nominally 100 fs or less) is progressively shortened in conjunction with spatial focusing of the beam. As the peak-intensity during a pulse depends on both the spatial size of the beam and the duration of the pulse, the intensity can be independently tuned by changing either of these two. In serial point scan implementations, focusing of the beam to a single point is achieved by only tuning the spatial size of the beam without any tuning of the duration of the pulse. In contrast, the apparatus and method of the present disclosure implements an optical projection scheme wherein the pulse duration is progressively reduced in proportion to the size of the beam such that the beam is both spatially and temporally focused on or within the interior of the resist material and wherein the location of spatial and temporal focused spots overlaps. This ensures that steep dosage gradients are achieved at the projected image plane even when the projected image is large (due to multiple focused spots). It is important to note that this projection scheme differs in form and function from that of conventional projection micro-stereolithography implementations due to the reliance on temporal properties of the wideband femtosecond pulsed laser source to achieve the focusing described herein. An important element of the temporal focusing technique is that the optical path lengths after the projection mask are designed to match for all optical frequencies in the beam only at the focused image plane but mismatched at all other planes. Thus, temporal focusing stretches the pulse by introducing a "chirp" and selectively minimizes (and ideally eliminates) this chirp only at the focused image plane.

Temporal focusing of wideband femtosecond laser sources has been previously applied for fluorescence imaging of biomaterials. This technique has also been used to demonstrate material removal based fabrication processes. It has been suggested that such temporal focusing systems can also be used for multiphoton lithography. However, these teachings fail to enable high-quality 3D printing of structures without undue experimentation. Underlying this failure is the key difference between the physical mechanism of multiphoton lithography (MPL) and that of imaging or material removal. Specifically, the dosage threshold behavior of resists used during MPL is distinct from that of material removal or imaging processes. In imaging and material removal, exposure dosage refers to the integrated photon energy; this is because the underlying physical processes are driven by the total amount of energy (dosage~intensity×time). In contrast, the exposure dosage during MPL nonlinearly combines the light intensity and the exposure time (dosage~(intensity)$^a$×(time)$^b$, where 'a' and 'b' are real positive numbers). As a result of this, prior art techniques that achieve dosage control by time averaging the light intensity are inappropriate for dosage control in MPL. If such techniques are used in MPL, either blobs of overexposed structures are generated or structures with underexposed regions are obtained. Herein, the tools and techniques for appropriate dosage control in parallelized MPL are presented.

It is important to note that the nonlinear dosage characteristic also affects proper selection of the laser source. As the threshold dosage is determined by the peak intensity of light (i.e., maximum instantaneous intensity), the peak intensity for all focused spots in the parallel scheme must be similar to that in the serial scanning technique. In serial scanning techniques, this focused intensity lies in the range of 0.1 to about 2 TW/cm$^2$. This suggests that for a field of view of a few hundreds of microns (i.e., focused beam size), the peak beam power should be in the range of ~1 GW. High repetition rate (>10 s of MHz) femtosecond laser oscillators and low repetition rate (~1 to 10 kHz) femtosecond laser amplifiers are among the potential choices for pulsed laser sources. Despite having similar average powers, laser amplifiers with high peak powers are preferred sources for parallel submicron additive manufacturing due to their 4 to 5 orders of magnitude (i.e., 10,000 to 100,000 times) higher peak powers.

FIG. 1 shows an apparatus 10 in accordance with one embodiment of the present disclosure. The apparatus 10 may include a pulsed laser source in the form of a laser amplifier 12, an optical parametric amplifier ("OPA") 14, a beam expander 16, a first high reflective ("HR") mirror 18, a beam homogenizer 20, a second HR mirror 22, a second beam expander 24, a tunable mask 26, an electronic digital mask control system 27 (which includes processor, memory and I/O), a concave mirror 30, a neutral density ("ND") filter 32, a short-pass filter ("SF") 36, a charge coupled display ("CCD") camera 40 an electrically tunable lens ("ETL") 42, an objective lens 44, a sample (comprising "photopolymer resist material" supported on optically clear slide) 48, a movable stage 50 and a lamp 52 projecting a beam 54 toward the sample 48 for imaging of the processing zone. This lamp 52 may be an incoherent light source of such a wavelength spectrum that does not affect photo-polymerization of the resist material.

In operation, the laser source 12 may be a pulsed laser source that provides the laser light that drives the writing process. A key feature of this laser source 12 is that it generates pulses with a broad wavelength spectrum instead of a single wavelength. One example of a suitable laser source is a femtosecond Ti-sapphire regenerative laser amplifier with a center wavelength of 800 nm, a pulse duration of 35 fs and a bandwidth of 40 nm. As shown in FIG. 1, light from the laser source 12 has its wavelength modified by the OPA 14, in one example from 800 nm to either 325 nm or 500 nm, before being further modified by the first beam expander 16, the beam homogenizer 20 and the second beam expander 24. The beam homogenizer modifies the shape of the beam from a non-uniform Gaussian profile to a uniform flat-top beam profile. Beam expanders 16 and 24 control the diameter of a beam 25 that illuminates the digital mask 26. Multiple beam expanders may be required to individually match the size of the beam to apertures of the various components such as the beam homogenizer and the tunable mask.

The tunable mask 26, in one example, may be a digital micro-mirror device ("DMD"). This component is commercially available from various manufacturers, for example Texas Instruments Inc. of Dallas, Tex. Alternatively, the tunable mask 26 may be formed by a spatial light modulator (SLM). The tunable mask may also be a strain-driven tunable diffraction grating such as those formed by wrinkling of supported thin films (e.g., see S. K. Saha and M. L. Culpepper, *Biaxial Tensile Stage for Fabricating and Tuning Wrinkles*, U.S. Pat. No. 9,597,833 B2, March 2017, hereby incorporated by reference into the present disclosure) or a fixed uniform or non-uniform grating mounted on a movable (rotating and/or translating) mount. The key feature of this tunable mask 26 that enables temporal focusing is that it is a dispersive optical element, i.e., it is capable of spatially separating the different optical frequencies (or wavelengths) of the incident beam. DMD, SLM, and tunable wrinkled films can all act as dispersive elements due to their periodic structure which diffracts light. When a laser source is incident onto such a dispersive element, it diffracts into multiple beams. The angular position of the diffracted beams is determined by the modes of diffraction. Each of these diffracted beams contains the full information about illuminated patterned subsections of the tunable mask in the form of individual beamlets that correspond to these subsections. These patterned subsections may correspond to individual mirrors in the DMD or individual peaks of a wrinkled grating wherein these subsections are themselves tunable. If the laser source is a broadband source, the beamlets (and the beams) emerging from the mask diverge instead of being in the form of a single beamlet or beam. This is because the angular position of the diffracted beamlets (and beams) is dependent on the specific wavelength. Due to the inverse relationship between spectral bandwidth and duration of pulse, this spatial divergence (induced by the dispersive mask) stretches the pulse duration and is a key feature that ensures temporal focusing. Tunability of the mask ensures that structures with various feature geometries can be printed. For the following discussion, it will be assumed that the tunable mask 26 is formed by a DMD.

Figure 2:
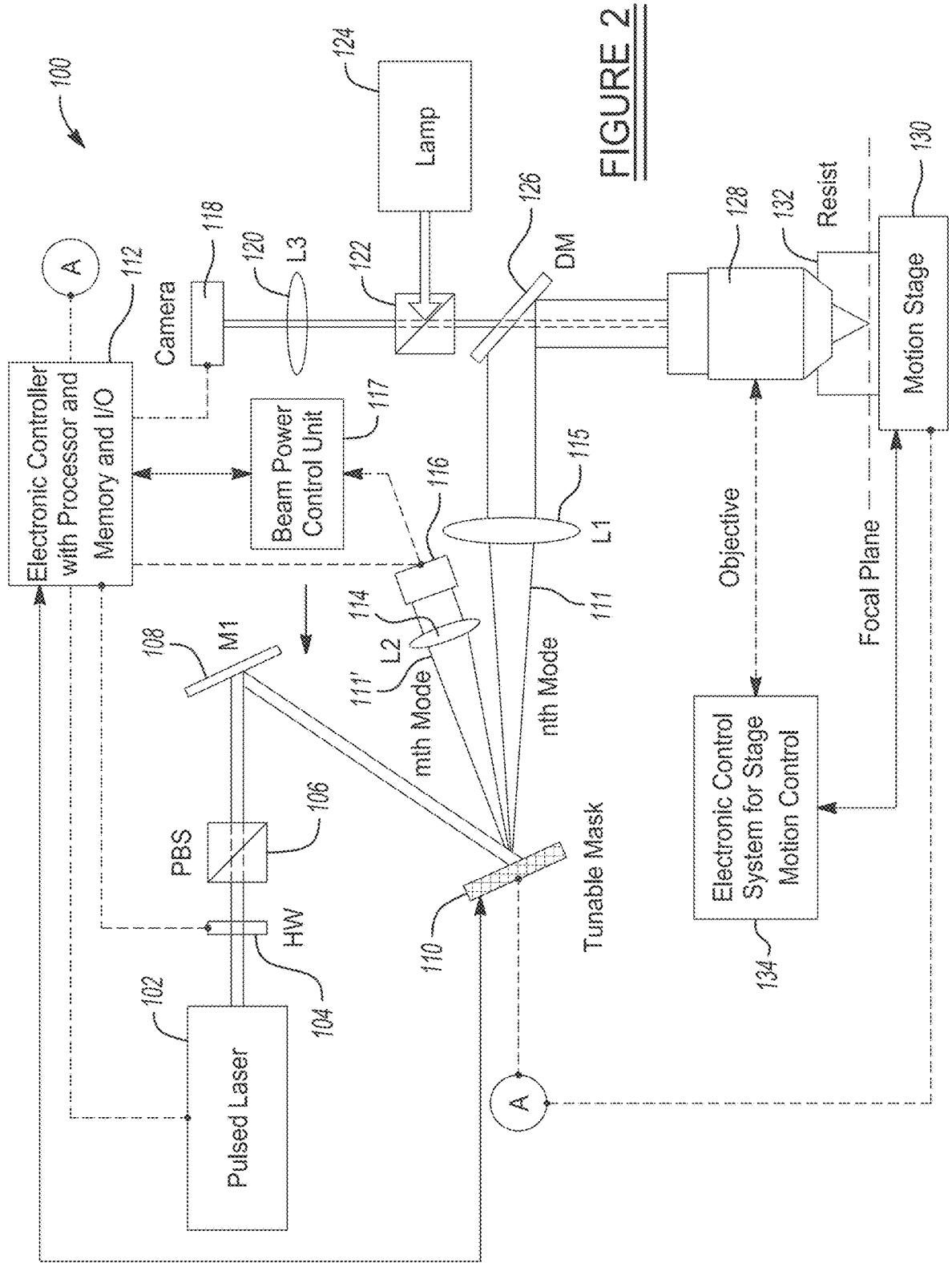
FIG. 2 is a high level block diagram of another embodiment of the present disclosure, somewhat similar to the apparatus of FIG. 1, but which also makes use of a power meter and a beam power control unit for controlling a power of a processing beam in real time.

With a DMD used as the tunable mask 26, a key feature is that each micro mirror of the DMD may be viewed as forming a pixel point, and each pixel point can be individually switched on or off. This is accomplished by rotating the mirror by a small angular amount between two predetermined positions (often +or −12 degrees). In one predetermined position the pixel (i.e., micro mirror) forms an "on" state where the intensity of light emerging from the micro mirror pixel via reflection and diffraction along a particular set of directions is high whereas the other predetermined position forms an 'off' state where the intensity of the emergent light along the same set of directions is zero or a low value. Here, the cutoff for the qualitative terms 'high' and 'low' is determined by the specific downstream application. Often, commercially available DMD systems are designed so that the ratio of intensity for the off versus on state along a particular propagation direction is almost zero for incoherent light. This illumination tuning is sufficiently high for two-photon lithography to achieve two different exposure states (high exposure versus zero exposure). For the high exposure state, exposure of the resist through a finite number of laser pulses is sufficient to affect polymerization. For the low exposure state, the intensity is too low to affect polymerization even with an infinitely large number of pulses due to the thresholding behavior of polymeric resist materials. The beamlets created from each of the "on" micro mirrors in the tunable mask 26 form a diverging beam which is denoted by reference number 28 and collectively form an image created using the tunable mask 26. Therefore, only the beam lets created from an "on" pixel within the tunable mask 26 are used to affect polymerization of material within the sample 48. The rest of the beamlets (i.e., all beamlets emerging from the 'off' pixels) may be re-directed into one or more light sinks. It is important to note that several diffracted beams emerge from the mask 26 and each of these diffracted beams comprises the "on" beamlets. These beams differ in the angular position (diffracted mode) and energy (mode efficiency). For polymerization, it is preferable to use the beam from only that mode which has the highest diffraction efficiency (i.e., the highest energy). Other modes (beams) may be used for diagnostics or re-directed into light sinks. The additional diffracted beams are not shown in FIG. 1 but one additional diffracted beam is shown in FIG. 2. The collimating optics (i.e., concave mirror 30) converts the diverging beam 28 into a collimated beam 34. While the collimating optics in this example is shown as the concave mirror 30, a suitable lens could also be used to provide the needed collimation of the diverging beam 28.

The collimated beam 34 then passes through the neutral density ND filter 32, through the short-pass filter 36, through the ETL 42, the objective lens 44, and is focused onto an X-Y plane inside the sample 48, as indicated by focused beam 46. The sample 48, as noted above, may comprise a photopolymer resist material. This focused X-Y plane is the conjugate plane of the tunable mask 26. An example of an objective lens suitable for use as the object lens 44 is a high numerical aperture but low to moderate magnification oil immersion infinity objective lens (such as a 40× 1.4 NA lens).

At the focused image plane on or within the sample 48, when the laser illumination is held for a finite duration of time, the exposure dosage at each point in the resist that corresponds to the "on" pixel in the tunable mask 26 is higher than the threshold dosage of the material comprising the sample 48; whereas, the exposure dosage at each point in the resist corresponding to an "off" pixel is below the threshold exposure dosage. Thus, a pixelated image of the tunable mask 26 is formed in an X-Y plane within the sample 48. This enables an entire layer within the sample 48 to be written out in one operation, as the beamlets of the beam 34 from "on" pixels are able to simultaneously write, in parallel, to a large plurality of points (i.e., on the order of $1\times10^6$ or more) in one operation. Thus, the ability to form each layer of the sample 48 with a plurality of beamlets that write in parallel enables a dramatic reduction in the time needed to create a finished part from the photopolymer resist material of the sample 48.

Three-dimensional structures may be fabricated by moving the focused image plane relative to the sample 48 using the movable stage 50. In actual practice, the motion of the movable stage 50 in the X-Y-Z plane may be controlled by an electronic control system 56. Alternatively, the movable stage 50 could be a fixedly supported stage (i.e., not movable) while the objective lens 44 is moved within a Z plane as needed. Still further, possibly both the movable stage 50 and the objective lens 44 could be moved simultaneously. However, it is anticipated that for the majority of applications, it will be preferred to move only one or the other of the movable stage 50 or the objective lens 44. Further, the focal plane of the objective lens 44 may be optically scanned in the axial Z (i.e., depth into the sample) direction using the electrically tunable lens (ETL) 42. The ETL provides the ability to rapidly move the final temporally-focused image plane without any mechanical movement of the objective lens or the movable stage, thereby leading to an increase in rate by as much as a factor of 10. More complex part geometries may be generated by replacing the movable X-Y-Z stage with a 6-axis movable stage that is capable of motions along all six degrees of freedom (i.e., capable of X, Y, Z translations and tip, tilt, and rotation angular displacements).

Figure 3:
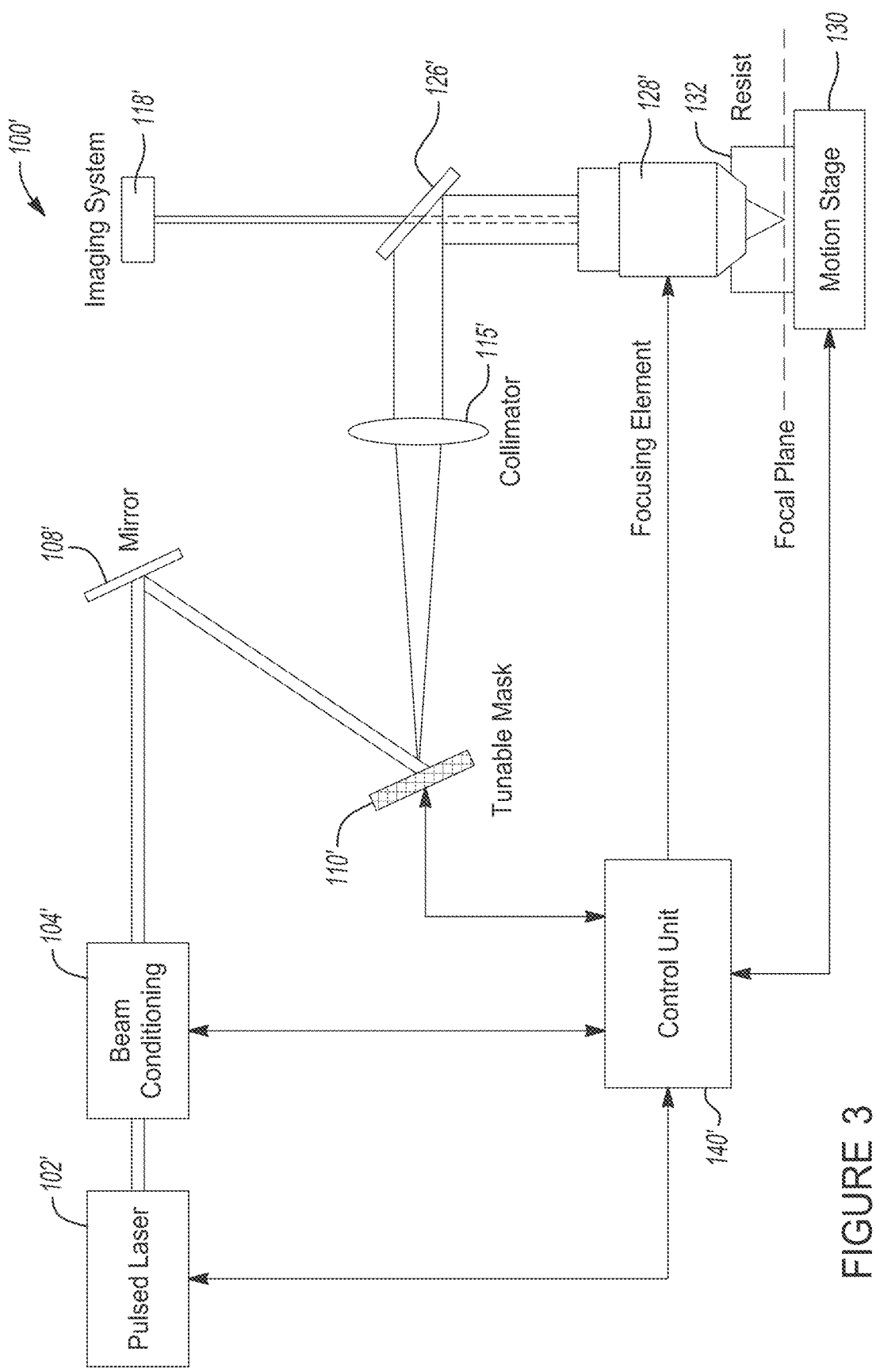
FIG. 3 is a high level block diagram of another embodiment of the present disclosure, that encapsulates key functions into sub-systems.

With the apparatus 10 described above, important features are thus the conditioning of the laser light from the laser source 12, the tunable mask 26, the axis of the concave mirror 30 (i.e., the collimating optics), and the relative size and position of the collimating optics (summarized in FIG. 3). The size and position of the collimating optics is relevant to the 3D printing processing capability because of the diverging and multi-beam nature of the beams emerging from the tunable mask. For the purpose of temporal focusing, all portions of at least one diverging beam (i.e., one diffracted mode) must be collected by the collimating optics. The gradient of light intensity at the focused image plane reduces if only a part of a diffracted mode is collected. This reduced intensity gradient will lead to a loss of depth resolvability during printing. In addition, partial sections of beams from other diffracted modes should be blocked to minimize intensity variations in the projected image. In addition, to increase the optical transmission efficiency the three elements (laser light, mask, collimating optics) are arranged such that a blazed grating condition is obtained for the tunable mask 26. A blazed grating condition requires that the light is incident on the blazed tunable mask 26 at a specific angle that is determined by the pixel spacing on the tunable mask, the center wavelength of the laser light beam and the blaze angle of the grating (i.e., the angle by which the mirrors in the DMD are turned). An explanation of the blazed grating condition is provided in the referenced article by Gu, C., Zhang, D., Wang, D., Yam, Y., Li, C., and Chen, S.-C., 2017, "*Parallel femtosecond laser light sheet micromanufacturing based on temporal focusing,*" *Precision*

*Engineering,* 50, pp. 198-203, the entire contents of which are incorporated into the present disclosure by reference.

To ensure high-quality printing, the concave mirror 30 (i.e., collimating optics) is arranged such that only the diffracted order that corresponds to the blaze condition is collected. Typically, this requires one to place the concave mirror 30 (i.e., collimating optics) at a predetermined angle to the face of the tunable mask 26 and to block the other orders by introducing apertures. This sets a condition on the maximum angular aperture. Additionally, one must ensure that all of the wavelengths (within the bandwidth of the laser source 12) are collected by the concave mirror 30 (i.e., the collimating lens). As the different wavelengths emerge at (slightly) different angles, this condition sets a minimum angular aperture for the collimating optics. Thus, the angular aperture over which the beamlets of the beam 28 must be collected onto the concave mirror 30 (i.e., collimating optics) must lie within a small band. Outside this band, the performance of the apparatus 10 may drop significantly to such an extent that depth resolvability for 3D printing is lost. Although this additional aperture-based design feature may appear an obvious design goal in light of this disclosure, past attempts at parallelizing multiphoton lithography using similar optical configurations have failed to demonstrate 3D depth resolvability (see Mills et al., supra) thereby suggesting that designing and configuring an optical system that is capable of depth-resolved parallel multiphoton lithography is non-trivial even when the system uses known components. It is important to note that these past attempts have been successful in melting-based machining operations despite failing in implementing polymerization-based depth-resolved multiphoton lithography. Thus, success in thermally-driven machining processes does not automatically guarantee that the underlying system could also successfully 3D print depth-resolved polymeric structures.

The apparatus 10 also facilitates the implementation of a grayscale printing method that ensures that high-quality parts can be fabricated. The grayscale printing method comprises the sequence of operations and the selection of writing conditions in these operations that leads to a non-uniform "dosage" during printing within the same projected image plane. The term "dosage" refers to the combined nonlinear effect of light intensity and duration of light exposure (in the form dosage~$(\text{intensity})^a \times (\text{time})^b$, where 'a' and 'b' are real positive numbers). Writing occurs at a point when the dosage at that point is above a threshold value ("threshold dosage") for a given photopolymer resist material. For writing, a pixel must be continuously switched "on" for a duration of time that is longer than the threshold exposure time (represented by vertical axis in FIG. 4) at the incident light intensity (represented by horizontal axis in FIG. 4). Non-uniform dosage can be achieved by selectively switching some pixels on or off to selectively increase or decrease the nonlinear dosage within the plane of the resist material. Practically, this can be achieved by sending a series of patterns (i.e., map of pixel "on" and "off" states) to the DMD and holding each of the patterns for finite durations of time. These pattern illumination durations would then be shorter than the maximum exposure time required for any spot within the field of projection. The net nonlinear dosage at any point within the resist material is the cumulative combined dosage from each projected image. Here, the field of projection refers to the maximum area of any focused image that can be projected onto/into the resist material. Thus, one may need to project a series of non-intuitive DMD patterns to print the desired structure at the focused plane through a process of sequentially projecting several DMD patterns and nonlinearly and cumulatively combining the effect of illumination intensity and duration of illumination.

In determining the range over which the net dosage can be tuned through this method, one must account for the shortest duration that a pixel can be switched on and the rate at which the power of the incident beam can be tuned. The shortest duration that a pixel can be switched "on" is determined by the pulse repetition rate of the laser source 12. Grayscale control enables tuning the total exposure time of each pixel between zero and the maximum required duration in steps of the reciprocal of pulse repetition rate. For example, if a projection field requires a maximum of 20 pulses, then with a laser source at a pulse repetition rate of 1 kHz the exposure time can be discretely tuned between 0 and 20 ms in steps of 1 ms. This is achieved by loading a new single-bit image onto the DMD 26 every 1 ms. The dosage can be further tuned if a high-speed (i.e., faster than ~10 ms response time) beam power control unit is incorporated into the system. Without this additional power control unit, the dosage can be discretely controlled over several grayscale levels that are separated by the reciprocal of pulse repetition rate. Beam power control would enable finer dosage control than this. It is important to note that the grayscale method for dosage control disclosed here is distinct from the intensity control schemes of commercial DMD masks (i.e., projectors). In commercial DMD projectors, time-averaged intensity of a pixel can be controlled over several levels by changing the ratio of rate at which the mirrors are switched between on and off states while the mirrors are continuously cycled between on and off states.

Figure 4:
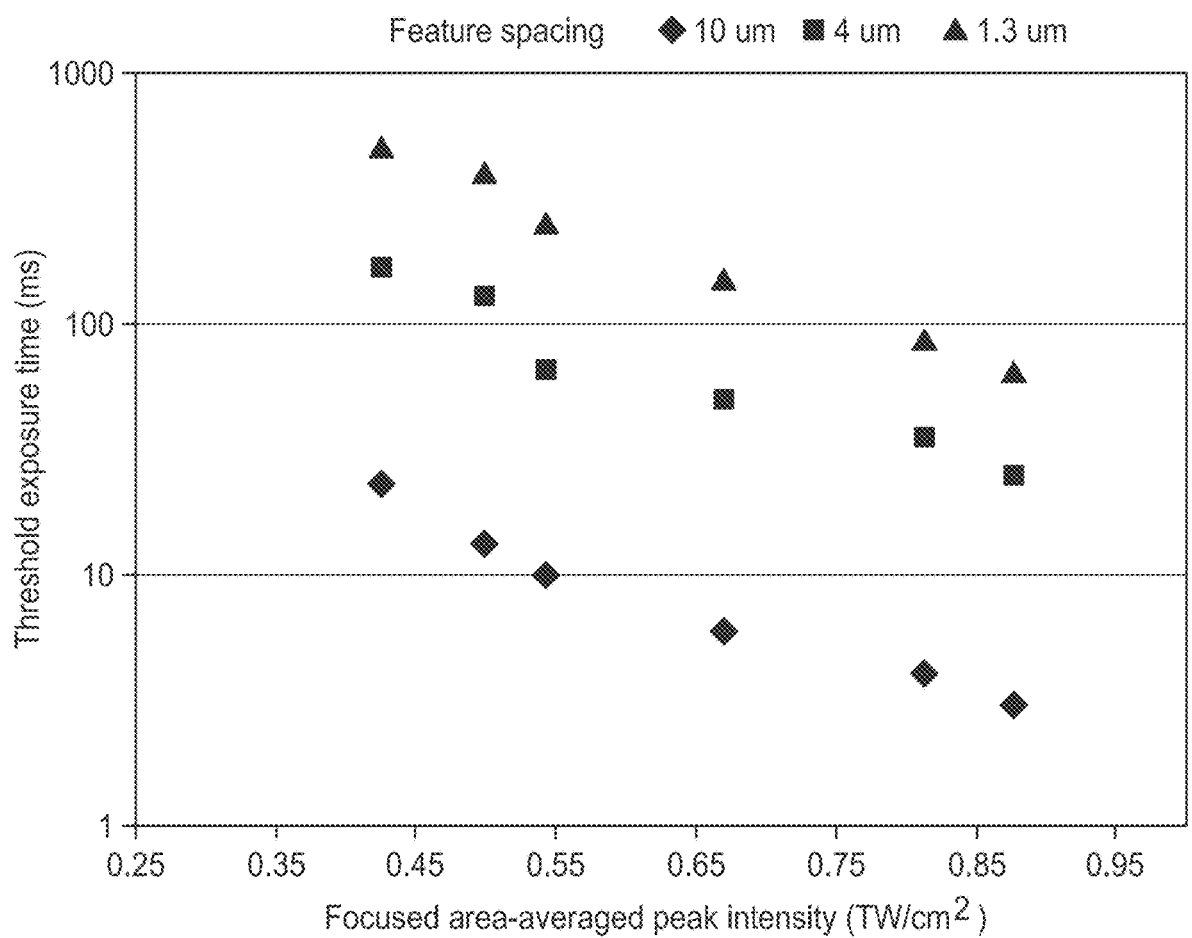
FIG. 4 is a graph illustrating the empirically derived dosage law in parallel two-photon lithography for a particular polymeric material being processed and at differing feature spacings.

It has also been experimentally observed that the threshold dosage depends on the proximity of features within the sample 48 as illustrated in FIG. 4. This figure shows the minimum threshold exposure time required to affect polymerization in the resist material when illuminated with specific peak intensity and for different feature spacings. In a sample part that contains closely spaced and sparsely spaced features, providing a uniform dosage leads to over or under exposure based defects. The grayscale dosage control of the grayscale printing method mentioned above allows for non-uniform control of dosage in the same focused plane. This is implemented by taking advantage of the pulsed nature of the laser light from the laser source 12 and the multi-pulse exposure threshold behavior of the material that makes up the sample 48. Traditionally, one would keep projecting one image per focused plane within the sample 48 until the desired uniform dosage is obtained at the particular plane within the sample. But with the present method, an important distinction is that instead of projecting the same image, multiple images may be sequentially projected at the same image plane. The digital image being created is altered so that the pixels of the tunable mask 26 at which the local dosage exceeds the non-uniform dosage threshold are switched off in the subsequent images. This tuning of the sequential images at the same image plane in the sample 48 may either be performed by prior experimental calibration of dosage laws (such as in FIG. 4) or in real-time by optically sensing the curing process through changes in contrast of images captured by the real-time imaging system (such as the imaging sub-system 118' in FIG. 3). The optical sensing system comprises a separate illumination lamp 52 but shares the same focusing elements 42 and 44 as the processing system to generate an image of the processing plane on the camera. This enables live imaging and recording of the printing process. To ensure that the optical sensing/visualization system does not interfere with the printing process, the wavelength of illumination in this system is selected to lie outside the absorption spectrum of the resist material.

Figure 5A:
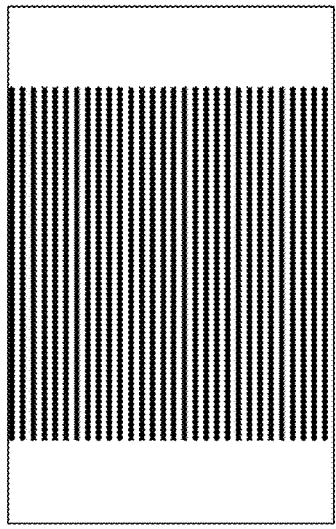
FIGS. 5a and 5b illustrate exemplary patterns of DMD "on" states (i.e., bright regions) for grayscale control, with FIG. 5a illustrating a pattern with both vertical bright bars and horizontal bright bars, FIG. 5b illustrating a pattern with only horizontal bright bars.
Figure 5B:
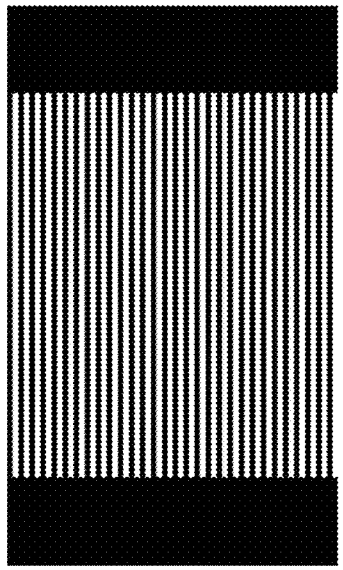
Figure 5C:
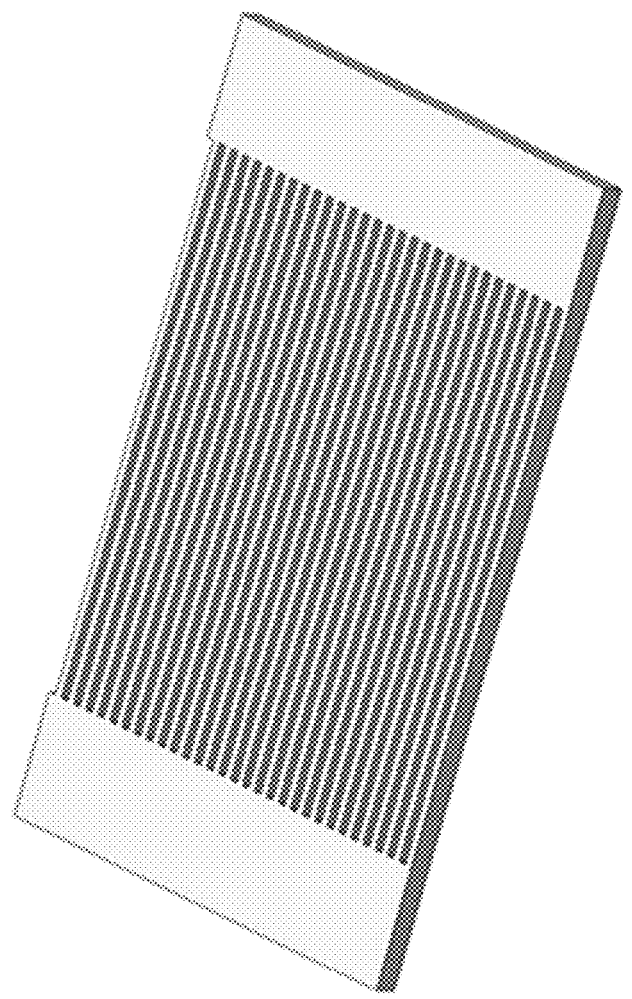
FIG. 5c illustrates the desired printed pattern in the photoresist material corresponding to the DMD patterns of FIGS. 5a and 5b.
Figure 5D:
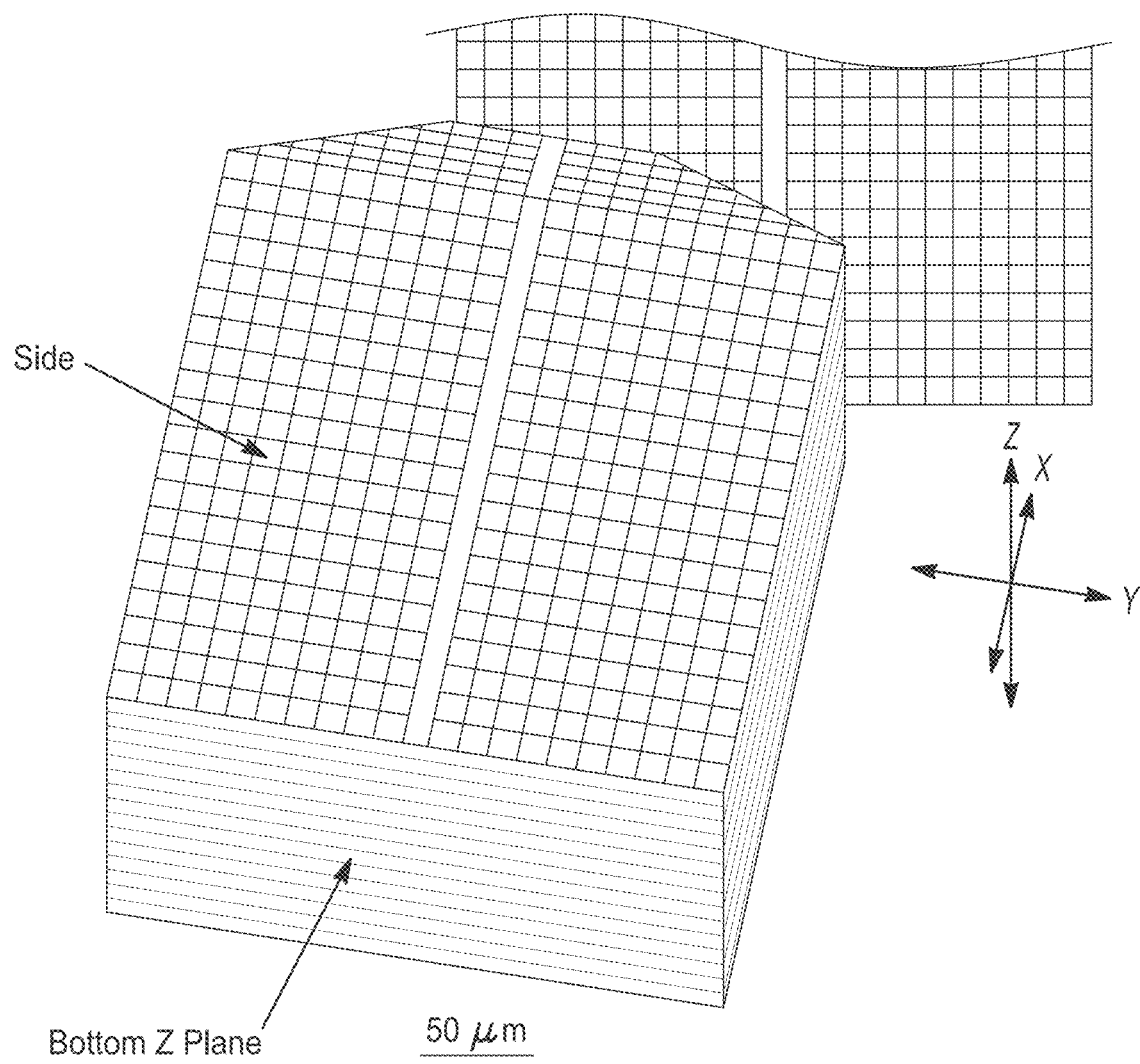
FIG. 5d illustrates an image obtained using a scanning electron microscope of a part in the foreground which has been manufactured using the teachings of the present disclosure, and illustrating the depth resolvability of the present disclosure to resolve individual Z planes of the part.

Thus, the grayscale dosage control technique described herein, as implemented by producing a plurality of sequential images at the same image plane, but with different dosages for each pixel of the image, enables printing of non-uniform parts without generating defects due to over or under-exposure. In particular, the printing of non-uniform parts having closely spaced but differing features, is now possible. Representative grayscale digital masks (pattern of DMD pixel "on" states) are shown in FIGS. 5a and 5b that are required to print the structure of FIG. 5c. FIG. 5D is a scanning electron microscope image obtained of an actual part manufactured using the teachings of the present disclosure, as shown in the foreground image. The foreground image has been toppled by rotating it about its Y-axis edge on a bottommost plane. The foreground image illustrates the individual depth resolved Z planes of a printed pillar structure, while the background image is shown in the "as-printed" upright orientation.

It should also be noted that time-averaged intensity is generally not a reliable measure of the exposure dosage during multiphoton lithography. As a consequence, commercial intensity control techniques that rely on time-averaging the intensity cannot be used for reliable dosage control. In addition, the grayscale technique presented, while being used to tune the total exposure time, is not capable of tuning the instantaneous or peak intensity. Although the intensity can be tuned by controlling the net power of the incident beam, feedback for such tuning is often not available in real time. As the diffraction efficiency of the DMD 26 is prone to change with the spatial frequency of the image, a one-time calibration of the transmitted power is not accurate for all images. This issue has been solved with another embodiment of the present disclosure which is shown in FIG. 2 as apparatus 100. The apparatus 100 is somewhat similar to the apparatus 10 in that it includes a pulsed laser source 102, a half wave plate 104, a polarizing beam splitter 106, a mirror 108, a tunable mask 110, an electronic control system 112 for controlling the tunable mask 110, a pair of collimating lenses 114 and 115 each used to collimate the beam it receives, a beam monitoring power meter 116, a beam power control unit 117, a camera 118 (the electronic control system 112 also controlling the camera 118 in this example), a lens 120, a beam splitter 122, a lamp 124, a dichroic mirror 126, an objective lens 128, a movable stage 130 positioned elevationally adjacent the objective lens (e.g., below the objective lens 128) for supporting a sample 132 (i.e., photopolymer resist) thereon, and an electronic control system 134 for controlling at least one of (or possibly both of) the motion of the movable stage 130 or the objective lens 128. Optionally a single electronic subsystem (e.g., system 112 or system 134) may be used to perform all the control operations for the apparatus 100.

The apparatus 100 differs from the apparatus 10 principally in its ability to continuously monitor one of the non-processing diffracted beams (i.e., the "mTh diffracted order" beam 111' in FIG. 2) from the tunable mask 110, and using the beam monitoring power meter 116 to monitor for changes in the beam power. The beam performing the processing, which may be termed the "processing beam" emitted from the tunable mask 110, is designated by reference number 111. The beam power control unit 117 is coupled to the power meter 116 for real-time beam intensity control of the beam incident onto the tunable mask. To control the power of the incident beam, the power control unit 117 may control a rotating half-wave plate 104 that is followed by a polarizing beam splitter 106. A polarization-based power control scheme is effective because pulsed laser sources often emit linearly polarized light. When polarization-based power control is implemented, polarization-dependent anisotropy of the multiphoton polymerization process may be minimized by introducing a quarter-wave plate to convert linearly polarized light into circularly polarized light before the light enters the objective lens. Another power control technique could be to rotate into position one of several neutral density filters into the path of the processing beam 111 before entering the objective lens or by introducing the filters into the path of the beam incident onto the tunable mask 110.

Referring to FIG. 3, a high level diagram is presented to show, in broader fashion, major subsystems of an apparatus 100' in accordance with the present disclosure. The apparatus 100' makes use of a pulsed laser beam 102' which is received by a beam conditioning subsystem 104'. The pulsed laser beam leaves the beam conditioning subsystem 104' and is reflected from a mirror 108' to a tunable mask 110'. The tunable mask 110' produces a beam that is directed to a collimator 115'. A collimated output beam from the collimator 115' is reflected from a mirror 126' toward a focusing element 128'. An imaging system 118' may be used to image the focal plane. A control unit 140' may be used to control the laser, beam conditioning unit, the imaging system, motion stages, or focusing elements by receiving feedback signals or synchronization trigger signals from the various units connected to the control unit.

Figure 6:
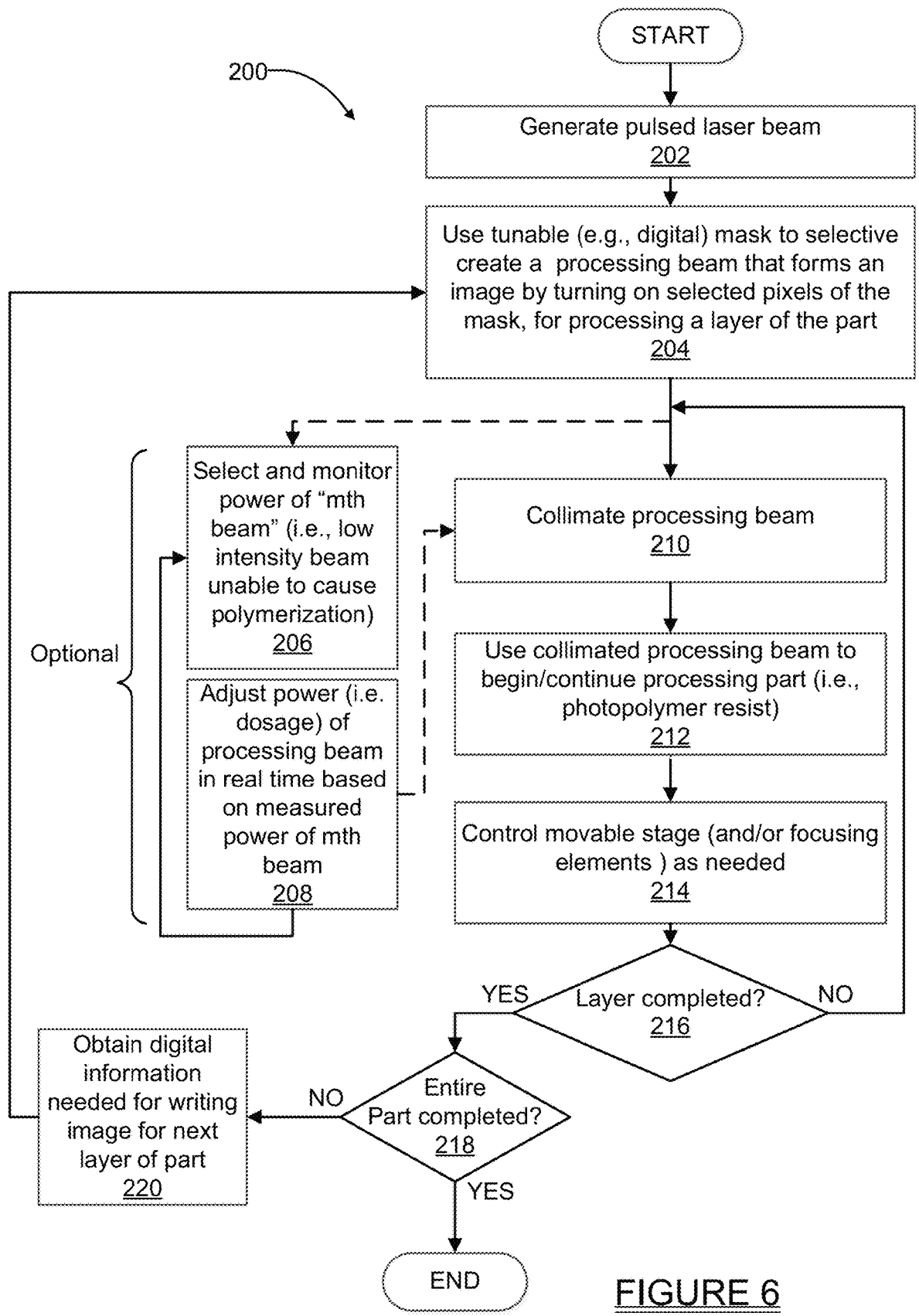
FIG. 6 is a high level flowchart illustrating basic operations that may be performed using the methodology of the present disclosure.

Referring briefly to FIG. 6, a high level flowchart 200 is shown of various operations that may be performed by the apparatus 10 or 100 or 100' in carrying out the methodology of the present disclosure. At operation 202 a pulsed laser beam is generated. At operation 204 the tunable mask (26 or 110) may be used to digitize the beam (i.e., discretely pattern subsections of the beam to have high vs low intensities) and selectively turn on only specific ones of the pixels within the mask to create the "processing beam" (i.e., beam 28 or 111) to use in processing a layer of the part (i.e., of the sample 132). Optionally, one of the beams not being used for processing (i.e., the "$m^{th}$ diffracted mode") may be selected and its power monitored, as indicated at operation 206. Also optionally, if operation 206 is performed, then at operation 208 the power of the processing beam may be adjusted in real time based on the measured power of the $m^{th}$ beam.

At operation 210 the processing beam may be collimated. At operation 212 the collimated processing beam may be used to begin/continue processing an entire layer within or on the sample (i.e., the photopolymer resist) in parallel. At operation 214 the movable stage (50 or 130) and/or the focusing elements (e.g., the objective lens 44 or 128 and/or the electrically tunable lens (ETL)) may be controlled as needed during the polymerization process. At operation 216 a check is made if the present layer being processed has been completed, and if not operations 206-216 may be repeated. If the check for completion of processing of the current layer at operation 216 produces a "Yes" answer, then a check is made at operation 218 if the entire sample part is complete (i.e., all layers processed/formed). If the check at operation 218 produces a "Yes", answer, then the process ends, but if the check at operation 218 produces a "No" answer, then digital information for writing the next layer of the part may be obtained, as indicated at operation 220, and operations 204-216 may be repeated to write out the next layer. To synchronize the various components of the system including the tunable mask, the control unit may wait for synchronization signals from the motion stages (for sample or objective) or the camera from the imaging system or for trigger signals from internal or external clocks (such as the pulsed laser itself). Without synchronization, printing in undesired locations of the resist material may be observed.

Synchronization of the laser illumination, tunable mask, and the motion stages also enables improving the resolution of the printing process through a "super-resolution" printing technique with a sub-pixel resolution. In this technique, the motion stage is moved before the exposure dosage at a spot can exceed the threshold dosage. By moving the stage by only a small amount so as to overlap the point spread function (PSF) of the illumination on top of the previously illuminated spot, it is possible to exceed the threshold dosage in only a fraction of the overlap region. Thus, this super-resolution printing enables printing features smaller than the features available without moving the stages during or between projections. This super-resolution printing can be implemented along all three axes (X, Y, Z) separately or in combination with each other to print finer features. Without any stage motion, super-resolution printing may be implemented by projecting a series of images from the tunable mask wherein images are offset from each other by at least a pixel. To obtain sub-pixel feature resolution, the duration of exposure of these images should be lower than the duration of exposure that corresponds to the threshold exposure dosage at the laser illumination intensity. When stage motion is combined with this pixel-offset projection technique, super-resolution printing may be simultaneously obtained along multiple axes.

Figure 7:
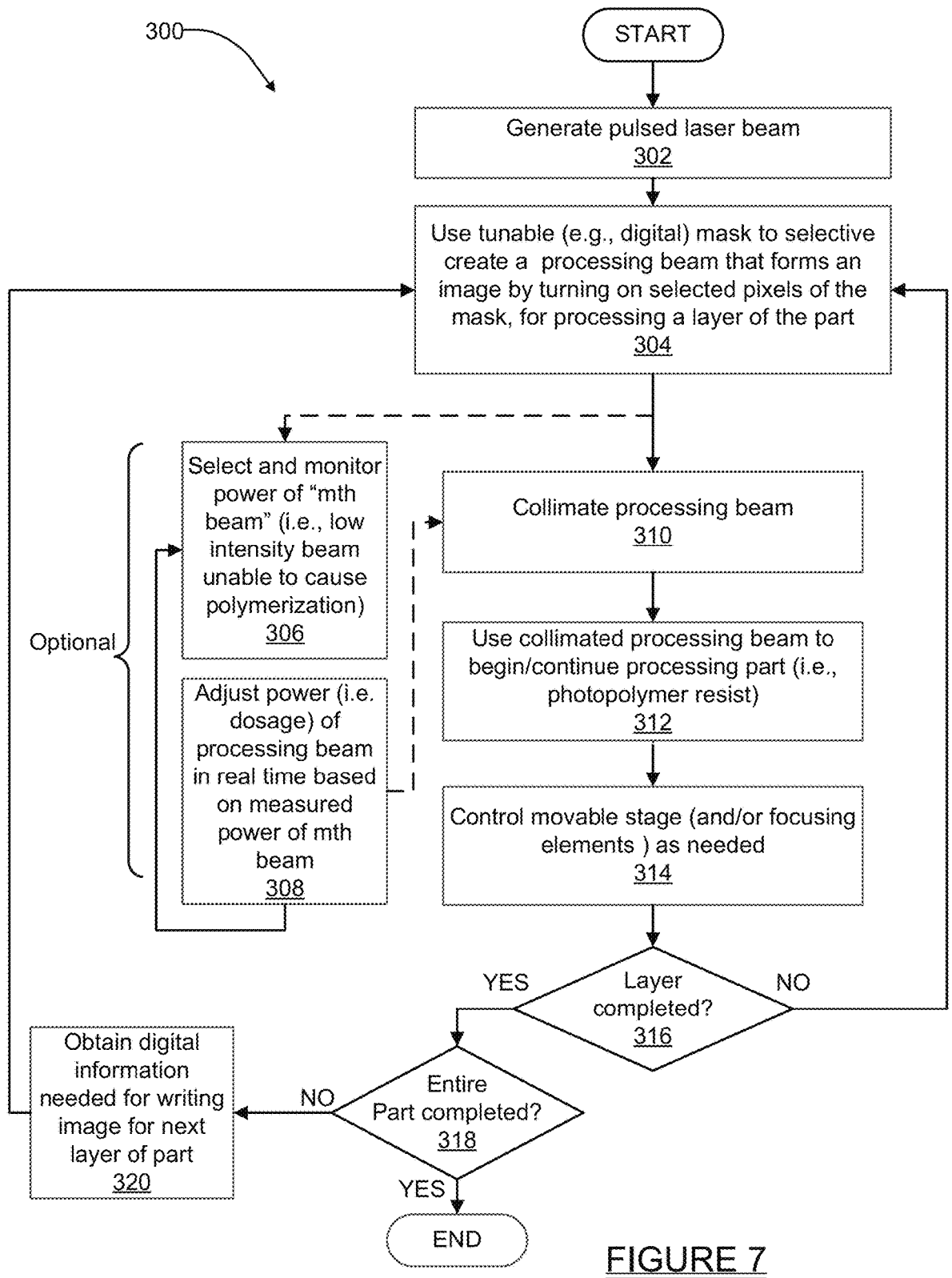
FIG. 7 is a high level flowchart illustrating basic operations that may be performed using the methodology of the present disclosure, with the steps that enable grayscale and super-resolution printing.

Although a major focus of this disclosure is on printing of submicron features, the systems and methods disclosed herein may also be used to print larger features on the scale of several micrometers. This may be achieved by simply swapping a high numerical aperture (NA) objective lens with a low numerical aperture objective lens. As feature sizes are determined by the spatio-temporal distribution of light intensity, a low-NA objective lens generates larger features. An advantage of using a low-NA lens is that one could benefit from the low magnification and wider fields of view of such lenses (such as low-NA 10× or 25× lenses versus high-NA 40× or 100× lenses). Such lenses would then significantly increase the area of light projection thereby increasing the overall printing rate by one to two orders of magnitude. Thus, a balance of tradeoff between rate of printing versus feature size resolution can be achieved by a combination of super-resolution printing and proper selection of objective lenses. Referring briefly to FIG. 7, a high level flowchart 300 is shown of various operations that may be performed by the apparatus 10 or 100 or 100' in carrying out the methodology of the present disclosure for the techniques of grayscale printing or super-resolution printing. The flowchart 300 differs from flowchart 200 in the ability to change the mask pattern or to move the stage and/or the focusing elements before writing of a particular layer is complete. This capability is essential to implement grayscale printing and super-resolution printing. More specifically, in FIG. 7 operations 302-320 correspond to the previously described operations 202-220 of FIG. 6. However, as noted above, with the methodology shown in FIG. 7, operations 304 and 310-316 (or alternatively operations 304-316) are re-performed if the check at operation 316 indicates that a currently processed layer is not complete. Re-performing operation 304 enables further control of the digital mask and/or the movable stage, when needed, to implement grayscale printing or super-resolution printing.

The various embodiments and methodology of the present disclosure described herein presents a new parallel, two-photon lithography technique that ensures depth resolvability on the order of a single micron, and an in-plane feature size less than about 350 nm. Arbitrarily complex structures may thus be generated by projecting a series of patterned "light sheets" that are dynamically tuned through the tunable mask (26 or 110). Although the method described herein may appear functionally similar to conventional DMD-based parallelization used in present day projection microstereolithography systems, the apparatus and method of the present disclosure implements a fundamentally different optical system that ensures that the light sheet (i.e., the projected image) is both spatially and temporally focused. By overcoming this barrier to depth resolvability in femtosecond projection optics, the present disclosure successfully increases the scale-up of rate by a factor of 100× while still maintaining the <350 nm feature size resolutions of high-quality serial techniques. Thus, the apparatus and method of the present disclosure eliminates a fundamental barrier to scaling up submicron additive manufacturing and transforms two-photon lithography into a viable system for high-volume additive manufacturing of functional parts with nanoscale features.

The various embodiments and methodology of the present disclosure are expected to have a wide range of applicability, for example in 3D printing applications in the microelectronics industry, in fabrication of high energy laser targets; in 3D printing applications for printing photonic crystals (i.e., sensors), in mechanical metamaterials (e.g., low density, high strength engineered metamaterials), and in microfluidics (e.g., for biomedical diagnostic strips), just to name a few examples of potential applications.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. An apparatus for performing an additive manufacturing operation to form a structure by processing a photopolymer resist material, the apparatus comprising:
    a laser source for generating a laser beam;
    a tunable mask for receiving the laser beam wherein the tunable mask comprises an optically dispersive element and is configured to generate a plurality of differing images;
    a control system configured to control the tunable mask to generate the plurality of differing images in sequential fashion;
    the tunable mask further being configured to split the laser beam into a plurality of emergent beams, wherein each said emergent beam emerging from the tunable mask comprises a subplurality of beamlets of varying or identical intensity, for each one of the differing images, and wherein each said beamlet from each said differing image emerges from a unique subsection of illuminated regions of the tunable mask during projection of each said differing image;
    a collimator for collecting and collimating at least one of the emergent beams, from each said differing image, from the tunable mask to form a collimated beam;
    a power monitoring unit to collect and measure the power of at least one of said plurality of emergent beams from each said image that are not being projected into a focused image plane and not delivered to the collimator;
    one or more focusing elements to focus the collimated beam into a focused beam which is projected as the focused image plane on or within the photopolymer resist material, wherein the tunable mask, the collimator, and the focusing elements are so oriented and positioned as to create the same optical path length between the tunable mask and the focused image plane for all optical frequencies of the laser beam; and
    wherein the focused beam simultaneously illuminates a layer of the photopolymer resist material, the focused beam using the differing images to generate a cumulative non-linear exposure dose within the focused image plane to selectively polymerize portions of the photopolymer resist material within the focused image plane.

2. The apparatus of claim 1, wherein an incident aperture of the collimator is large enough to collect all wavelengths contained within a single one of the emergent beams emerging from the tunable mask but sufficiently small to block all wavelengths of all other ones of the emergent beams.

3. The apparatus of claim 1, wherein the collimator comprises a convex lens or a concave mirror.

4. The apparatus of claim 1, further comprising a motion stage to support and move the resist material relative to the focused image plane.

5. The apparatus of claim 4, further comprising a motion stage to support the one or more focusing elements and to axially move the focused image plane toward or away from the resist material.

6. The apparatus of claim 1, wherein at least one of the one or more focusing elements comprises a focus-tunable optics comprising an electrically tunable lens (ETL).

7. The apparatus of claim 1, further comprising a power monitoring system to monitor the power of at least one of the emergent beams emerging from the tunable mask that are not focused on the resist material.

8. The apparatus of claim 7, further comprising a power control unit including at least one of:
    a rotating half-wave plate followed by a polarizing beam splitter to control the power of the beam received by the tunable mask; or
    a rotating neutral density filter wheel to control the power of the beam received by the tunable mask.

9. The apparatus of claim 1, wherein the tunable mask comprises a digital micromirror device (DMD).

10. The apparatus of claim 1, further comprising an imaging system using an incoherent optical source to monitor the focused beam illuminating the photopolymer resist material.

11. The apparatus of claim 1, wherein the tunable mask comprises a spatial light modulator (SLM).

12. An apparatus for performing an additive manufacturing operation to form a structure by processing a photopolymer resist material, the apparatus comprising: a laser source for generating a pulsed laser beam having a non-uniform Gaussian profile; a beam homogenizer configured to receive the pulsed laser beam and to convert the non-uniform Gaussian profile to a uniform flat-top profile; a tunable mask for receiving the pulsed laser beam, wherein the tunable mask includes a digital micromirror device (DMD) including a plurality of independently controllable pixels that may be turned on or off; a control system for configured to control the tunable mask to generate a plurality of differing images in sequential fashion; the tunable mask further being configured to split the pulsed laser beam into a plurality of emergent beams, for each one of said plurality of differing images, wherein each said emergent beam emerging from the tunable mask comprises a subplurality of beamlets of varying or identical intensity, for each one of said plurality of differing images, and wherein each said beamlet emerges from a unique pixel; a collimator for collecting and collimating all wavelengths of only a select one of the plurality of emergent beams, from each one of said differing images, from the tunable mask, and the collimator being configured to block all wavelengths of all other ones of the emergent beam, to produce a collimated beam; one or more focusing elements to focus the collimated beam into a focused beam which is projected as a focused image plane on or within the photopolymer resist material, wherein the tunable mask, the collimator, and the focusing elements are so oriented and positioned as to create the same optical path length between the tunable mask and the focused image plane for all optical wavelengths of the pulsed laser beam, and for each one of the differing plurality of images; a power monitoring unit configured to collect and measure the power of at least one of said plurality of emergent beams that are not being projected into the focused image plane and not delivered to the collimator; a motion stage to support and move the photopolymer resist material relative to the focused image plane; and wherein the focused beam simultaneously illuminates a layer of the photopolymer resist material using the plurality of differing images, and in connection with movement of the photopolymer resist material by movement of the motion stage, generates a cumulative non-linear exposure dose within the focused image plane to selectively polymerize portions of the photopolymer resist material within the focused image plane.

13. The apparatus of claim 12, wherein the tunable mask is oriented at such an angle to the pulsed laser beam being received as to generate a blazed grating condition for the center wavelength of the pulsed laser beam being received.

14. The apparatus of claim 12, further comprising a power monitoring unit to collect and measure the power of at least one of said plurality of emergent beams that are not used to generate the focused image plane.

15. The apparatus of claim 14 further comprising a power control unit including one of:
  a rotating half-wave plate followed by a polarizing beam splitter; or
  a rotating neutral density filter wheel to control the power of the pulsed laser beam received by the tunable mask.

16. The apparatus of claim 12, further comprising a control unit to tune the DMD upon receiving a trigger signal from an internal or external clock.

17. The apparatus of claim 12, wherein one of the focusing elements comprises an electrically tunable lens (ETL) to optically translate an axial position of a focal plane toward or away from the photopolymer resist material.

18. The apparatus of claim 17, further comprising a control unit to tune the DMD upon receiving synchronization or trigger signals from at least one of:
  the motion stage supporting the photopolymer resist material;
  the ETL;
  an internal clock; or
  an external clock.

* * * * *